United States Patent [19]
Ashida et al.

[11] Patent Number: 5,634,093
[45] Date of Patent: May 27, 1997

[54] METHOD AND CAD SYSTEM FOR DESIGNING WIRING PATTERNS USING PREDETERMINED RULES

[75] Inventors: Tadashi Ashida; Yoshiei Endou, both of Tokyo, Japan

[73] Assignee: Kabushiki Kaisha Toshiba, Kanagawa-ken, Japan

[21] Appl. No.: 384,468

[22] Filed: Feb. 2, 1995

Related U.S. Application Data

[63] Continuation of Ser. No. 826,463, Jan. 27, 1992, abandoned.

[30]     Foreign Application Priority Data

Jan. 30, 1991   [JP]   Japan ...................................... 3-009787

[51] Int. Cl.$^6$ ................................................. H01L 23/528
[52] U.S. Cl. ...................... 395/143; 395/964; 364/474.24
[58] Field of Search ...................................... 395/161, 133, 395/134, 135, 136, 137, 138, 139, 140, 141, 142, 143; 364/474.24, 474.25, 491, 777

[56]             References Cited

U.S. PATENT DOCUMENTS

| | | | |
|---|---|---|---|
| 3,567,914 | 3/1971 | Neese et al. | 364/491 |
| 4,768,154 | 8/1988 | Sliwkowski | 364/491 |
| 4,777,606 | 10/1988 | Fournier | 364/491 |
| 4,813,013 | 3/1989 | Dunn | 395/159 |
| 4,945,498 | 7/1990 | Mitamura | 395/141 |
| 4,984,180 | 1/1991 | Wada et al. | 364/474.24 |
| 5,021,968 | 6/1991 | Ferketic | 364/505 |
| 5,046,017 | 9/1991 | Yuyama et al. | 364/491 |
| 5,115,400 | 5/1992 | Watanabe et al. | 364/474.24 |
| 5,122,965 | 6/1992 | Nishida et al. | 364/474.24 |
| 5,124,273 | 6/1992 | Minami | 364/491 X |
| 5,198,987 | 3/1993 | Shindo et al. | 364/490 |
| 5,265,197 | 11/1993 | Kondo | 395/161 X |
| 5,299,307 | 3/1994 | Young | 395/161 |
| 5,410,496 | 4/1995 | Bolon et al. | 364/578 |
| 5,420,972 | 5/1995 | Johnson, Jr. et al. | 395/143 |
| 5,444,833 | 8/1995 | Kawai et al. | 395/133 |
| 5,461,577 | 10/1995 | Shaw et al. | 364/491 |

OTHER PUBLICATIONS

Chasen, Geometric Principles and Procedures for Computer Graphic Applications, 1978, pp. 209–211.
Mortenson, Computer Graphics Handbook, 1990, p. 5.
Marple et al, Tailor: A Layout System Based on Trapezoidal Corner Stitching, IEEE Transactions on Computer Aided Design, vol. 9, No. 1, Jan. 1990, pp. 66–90.
Jensen et al, Harvard Graphics: The Complete Reference, 1990, pp. 572–575, 568.
Welt, Nomad: A Printed Wiring Board Layout System, Daldacts, 1975, pp. 152–161.
Schiele et al., A Gridless Router for Industrial Design Rules, IEEE/ACM Design Automation Conference, 1990, pp. 626–631.
Sun, An Octagonal Geometry Compactor, Computer Design ICCS '88, 1988, pp. 190–193.
Taub, Canvas 3.0, MacUser, Jan. 1992, pp. 48–49.
Johnson, Vellum Pushes 3-D Envelope, MacUser, Jan. 20, 1992, pp. 37–38.

*Primary Examiner*—Heather R. Herndon
*Assistant Examiner*—Anton W. Fetting
*Attorney, Agent, or Firm*—Finnegan, Henderson, Farabow, Garrett & Dunner, L.L.P.

[57]            ABSTRACT

In a CAD system for designing wiring patterns, a wiring start point and a wiring end point are selected from a component placement drawing of a printed wiring board displayed on a display screen using a pointing device. The pointing device is used to designate a point through which the wiring will pass. When this designated point is neither in the horizontal nor vertical direction from the wiring start point, a pattern having two segments is drawn from the wiring start point to the designated point. One of the two segments is a vertical or horizontal segment. The other segment is an oblique segment at a predetermined angle to the horizontal. It can then be determined which of the two segments is to be drawn from the wiring start point. A pattern is similarly drawn from a last designated point to a new designated point.

18 Claims, 7 Drawing Sheets

METHOD AND CAD SYSTEM FOR DESIGNING WIRING PATTERNS USING PREDETERMINED RULES

This application is a continuation, of application Ser. No. 07/826,463, filed Jan. 27, 1992, now abandoned.

BACKGROUND OF THE INVENTION

1. Field of the Invention

The present invention relates to a CAD (Computer Aided Design) system for use in designing wiring patterns of a printed wiring board or the like and a method for designing wiring patterns using a CAD.

2. Description of the Related Art

Thus far, when wiring patterns of a printed wiring board are designed with a CAD system, they are generated on a grid predetermined in the CAD system (the grid is hereinafter referred to as a basic grid) (wiring patterns generated on the basic grid are hereinafter referred to as grid patterns). The basic grid dimension is generally set to 2.54 mm, or 0.1 inch. There may be provided subgrids which divide the basic grid into smaller sections, for example 0.635 mm, 0.508 mm and 0.3175 mm.

However, as demands for small size and high integration of mounted components increase, the necessity of generating wiring patterns which cannot be placed on the basic grid arises. (Hereinafter, wiring patterns which cannot be placed on the basic grid are referred to as non-grid patterns.) These non-grid patterns have been generated by using a method where wiring patterns are generated on a grid with close dimensions. Another method is where horizontal or vertical start patterns are drawn from a terminal to any line in the X direction or the Y direction of the basic grid and then the following patterns are generated on the basic grid. By using such conventional non-grid pattern generation methods, the density of components mounted on printed wiring boards has been improved to some extent. However, since the kinds of components for use on printed wiring boards varies and components with different terminal intervals are used on one printed wiring board, a method where non-grid patterns can be further readily and flexibly designed is strongly desired.

In the method where the dimension of the grid is made closer to generate non-grid patterns, since optimum patterns are retrieved by using the basic grid, the retrieval efficiency is high. However, all of the terminals of the components to be used should be placed on the grid. Thus, the operator should design wiring patterns, while considering the grid. In addition, since the grid dimension is frequently changed, pattern defects, where intervals of patterns are not sufficient, may take place.

In another method where horizontal or vertical patterns are stored from terminals to at least one of a line in the X direction or the Y direction of the grid, when the shape of a component terminal is not round (for example, rectangular or oval), a line can be drawn to the direction along the shape of the terminal, namely in the horizontal direction or the vertical direction. However, when the shape of the terminal is round, since the drawing direction of the line is not always horizontal or vertical, the limitation of drawing direction degrades the operability of the system.

SUMMARY OF THE INVENTION

An object of the present invention is to provide a method for readily designing wiring patterns of a printed wiring board including non-grid patterns.

Another object of the present invention is to provide a CAD system for readily designing wiring patterns of a printed wiring board including non-grid patterns.

To accomplish the above mentioned objects, the present invention provides a method used in a CAD system for designing a wiring pattern comprising the steps of identifying a beginning point of the pattern on a screen, designating a point on the screen and generating a wiring pattern having a longer side segment and an oblique segment, the beginning point and the designated point forming diagonal corners of a rectangle with sides in the horizontal direction and sides in the vertical direction, the longer side segment going from one of the beginning point and the designated point along the long side of the rectangle to the intersection with the oblique line, the oblique segment going from the other point to be connected to the longer side segment at a preset angle relative to the horizontal.

According to the present invention, even if a wiring start point is not present on a grid, by placing a designated point on the grid, a pattern can be automatically started from a wiring start point vertically, horizontally, or at a desired angle and ended at the designated point. Thereafter, the following pattern can be generated along the grid. Moreover, even if a wiring end point is not present on the grid, a similar wiring pattern can be generated so as to automatically end a segment to a wiring end point vertically, horizontally, or at a desired angle. Furthermore, a wiring pattern can be readily designed in accordance with the shape of a component terminal which is a wiring start point or a wiring end point.

Another object of the present invention is that the above CAD system for designing wiring patterns is equipped with a wiring pattern checking means so as to prevent defective wiring patterns from being designed.

Further objects and features of the present invention will become clear with the following description in accordance with the accompanying drawings.

DESCRIPTION OF PREFERRED EMBODIMENTS

Figure 1:
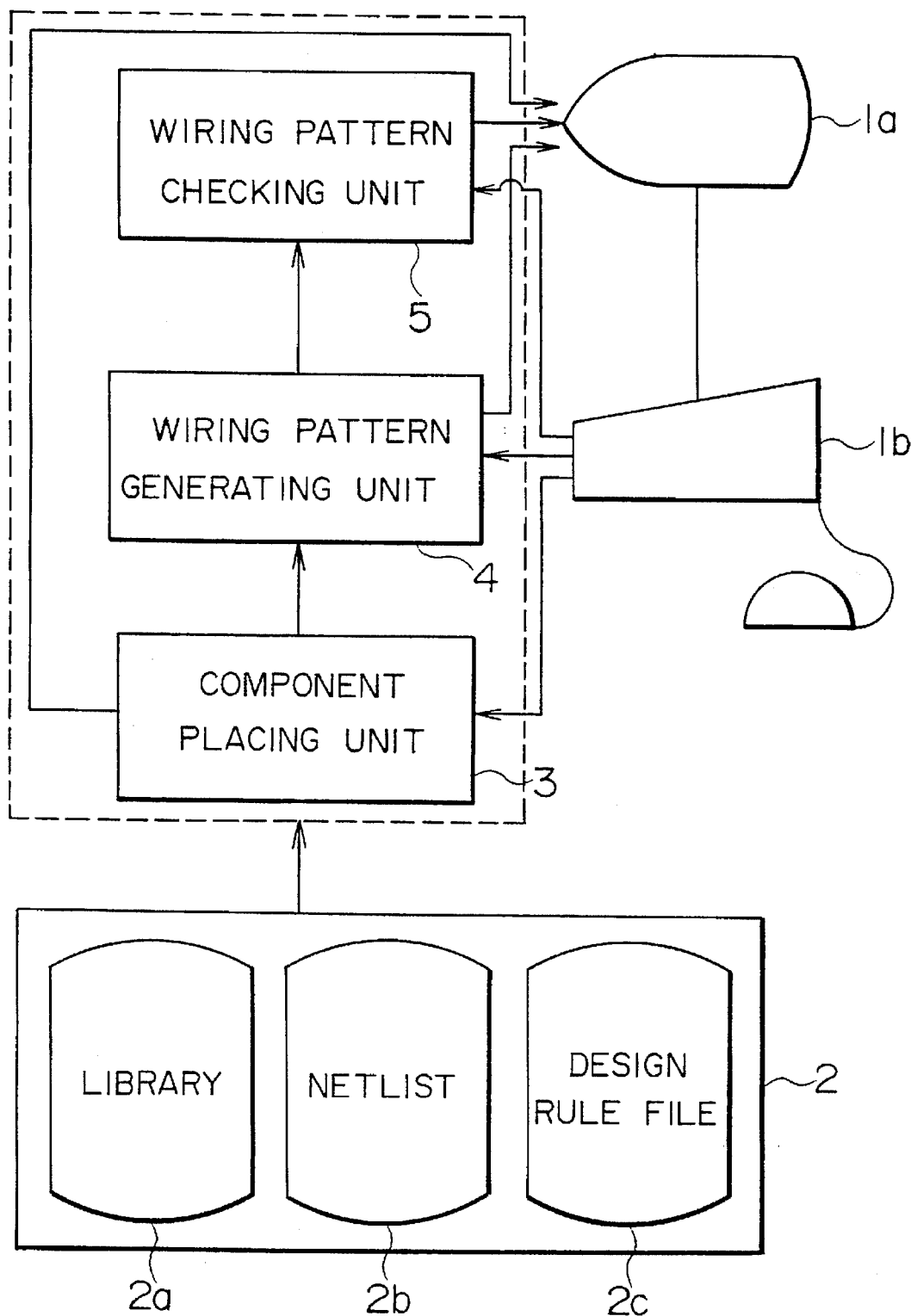
FIG. 1 is a block diagram showing the schematic structure of a CAD system according to the present invention.

As shown in FIG. 1, a CAD system for designing component placements and wiring patterns of a printed wiring board comprises a display 1a, an input device 1b such as a keyboard and a mouse, a storage device 2, a component placing unit 3, a wiring pattern generating unit 4, and a wiring pattern checking unit 5. The display 1a displays information necessary for designing wiring patterns such as a component placement drawing on a printed wiring board. The input device 1b is a means for inputting necessary information such as a wiring start point, a wiring end point, a designated point and a wiring pattern setting signal in accordance with screen information displayed on the display 1a. The storage device 2 stores data necessary for the design of component placements and wiring patterns on a printed wiring board. The component placing unit 3 generates an optimum component placement drawing in accordance with data stored in the storage device 2. The wiring pattern generating unit 4 generates a wiring pattern between a wiring start point and a wiring end point on a component placement drawing generated by the component placing unit 3, in accordance with information which is input through the input device 1b, the information including coordinate information of a wiring start point, a wiring end point, and any point designated therebetween. The wiring pattern checking unit 5 checks whether or not a wiring pattern generated by the wiring pattern generating unit 4 has enough distance to other elements on the printed wiring board.

Figure 2:
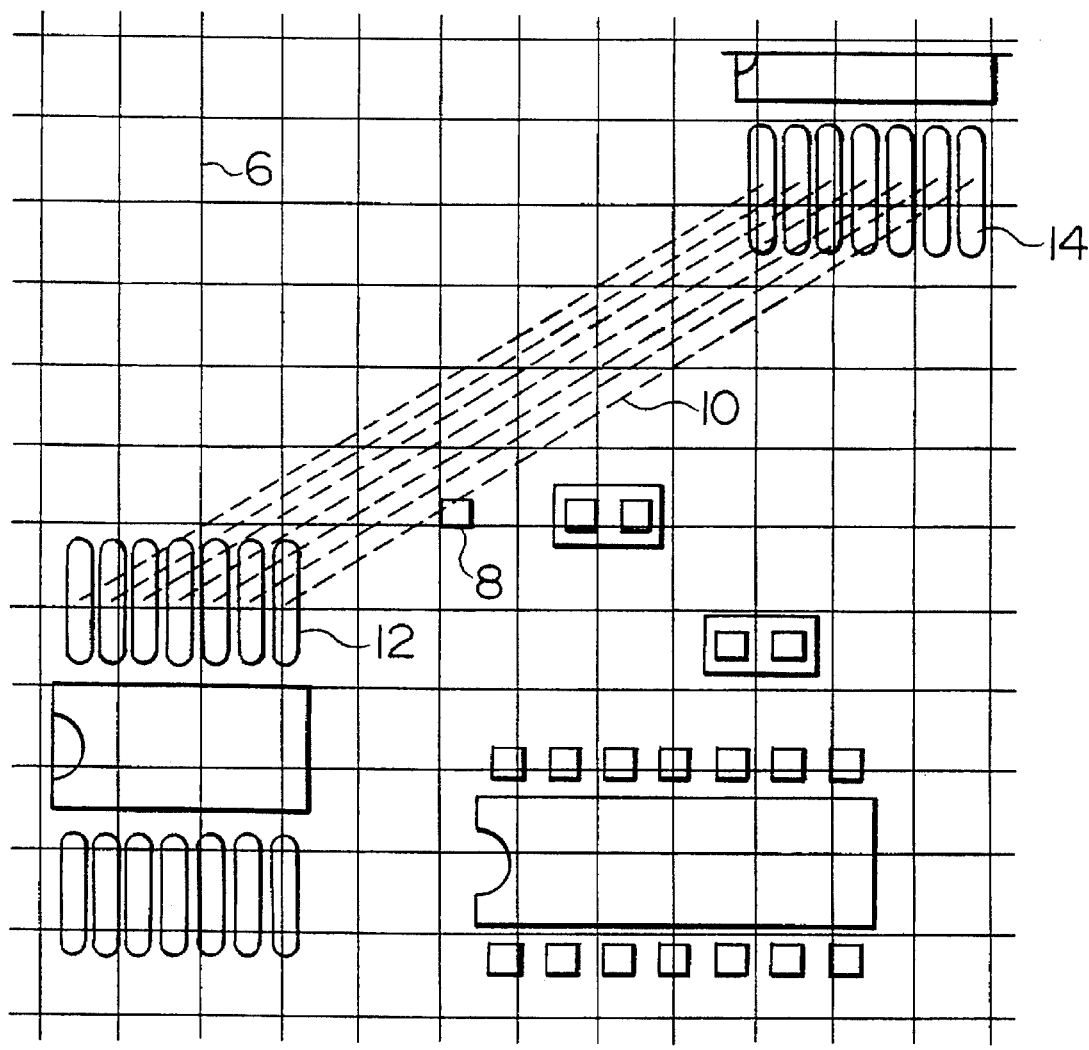
FIG. 2 is a view showing a component placing drawing and describing a designation method of a wiring route.

When a wiring pattern is designed, a component placement drawing of, for example, a printed wiring board as shown in FIG. 2 is displayed on the display 1a. On the component placement drawing of the printed wiring board, terminals to be wired are connected with straight lines (dotted lines in the figure) and displayed. In addition, a grid 6 which is a reference for designing a wiring pattern is also displayed on the display 1a. This component placement drawing of the printed wiring board is automatically designed and displayed by the component placing unit 3, in accordance with data of a LIBRARY 2a for storing the shape and the number of terminals of each component, a NETLIST 2b for storing each component name and signal information of each terminal connection, and a design rule file 2c for storing information of layer construction of each printed wiring board, the allowable values of distances between all elements such as mounting components and wiring patterns, and information of grid dimension, and so forth. Such an automatic design of a component placement drawing has already been realized by a software developed by RACAL-REDAC. The LIBRARY 2a, the NETLIST 2b, and the design rule file 2c are stored in the storage device 2.

Figure 3:
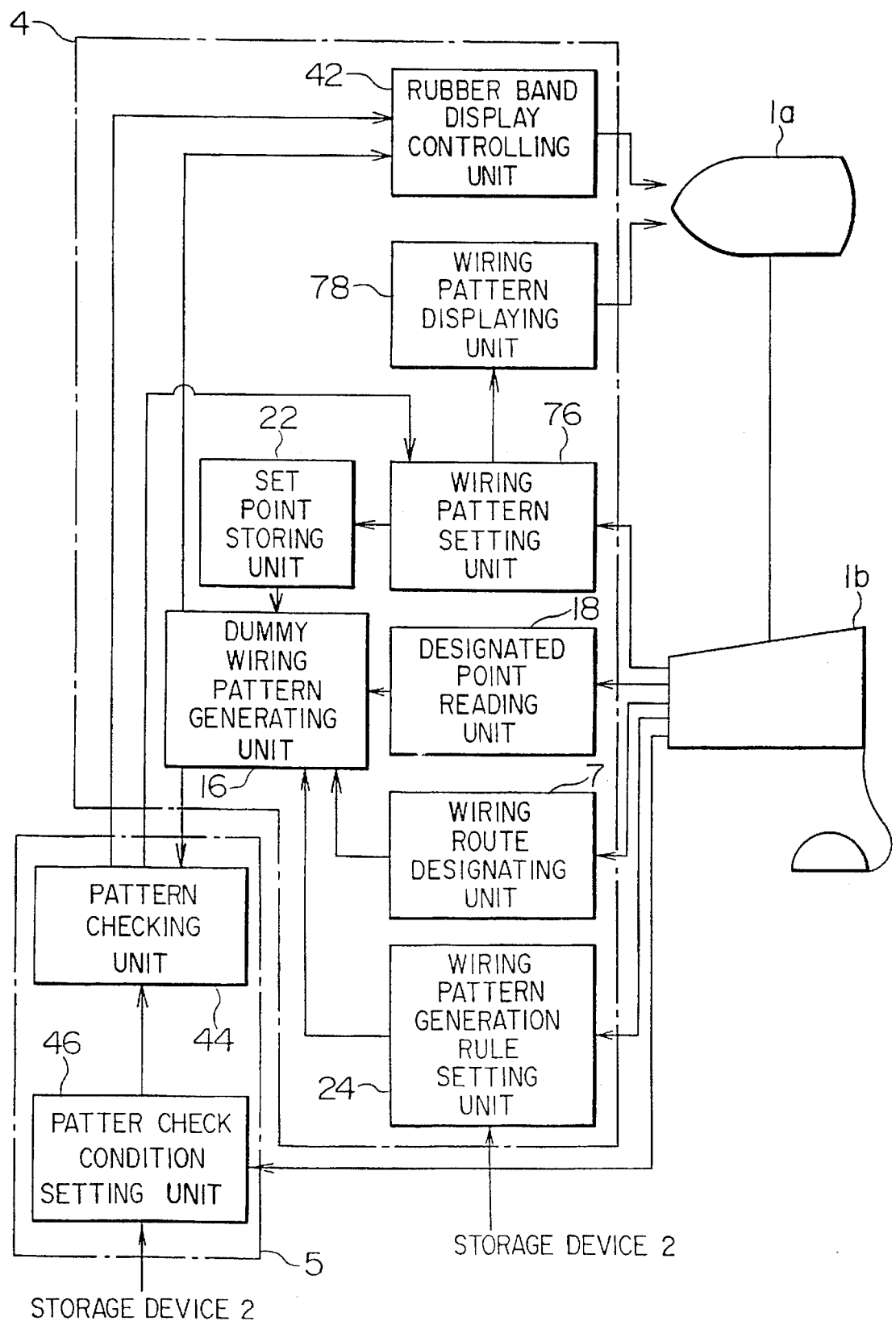
FIG. 3 is a block diagram showing the further detailed structure of a CAD system according to the present invention.

In accordance with the component placement drawing of the printed wiring board displayed on the display 1a, a wiring pattern is interactively designed. Next, the designing process will be described with reference to FIG. 2, FIG. 3 (which shows in detail the functions of the wiring pattern generating unit 4 and the wiring pattern checking unit 5 of FIG. 1), and FIG. 4 (which shows an example of wiring pattern generation steps).

As shown in FIG. 2, when the pointing device or the like such as the mouse picks a non-connected route 10 to be wired, a wiring route designating unit 7 recognizes one end point 12 of the non-connected route 10 which is close to the cursor 8 in a straight line as a wiring start point 12; and the other end point as a wiring end point 14. Thereafter, the wiring route designating unit 7 notifies a dummy wiring pattern generating unit 16 of the wiring start point 12 and the wiring end point 14.

After the wiring route designating unit 7 determines the wiring start point 12 and the wiring end point 14, the operator may use a mouse or other pointing device to designate a point through which the wiring route will pass, for example, 20a. The coordinates of the designated point 20a are supplied to a dummy wiring pattern generating unit 16 by a designated point reading unit 18.

The dummy wiring pattern generating unit 16 compares the supplied designated point coordinates to the coordinates of the wiring end point 14 supplied from the wiring route designating unit 7 to determine if they are the same. If they are not, the dummy wiring pattern generating unit 16 generates a dummy wiring pattern between the wiring start point 12 and the designated point 20a in accordance with a start wiring pattern generation rule which has been set by a wiring pattern generation rule setting unit 24.

Figure 4:
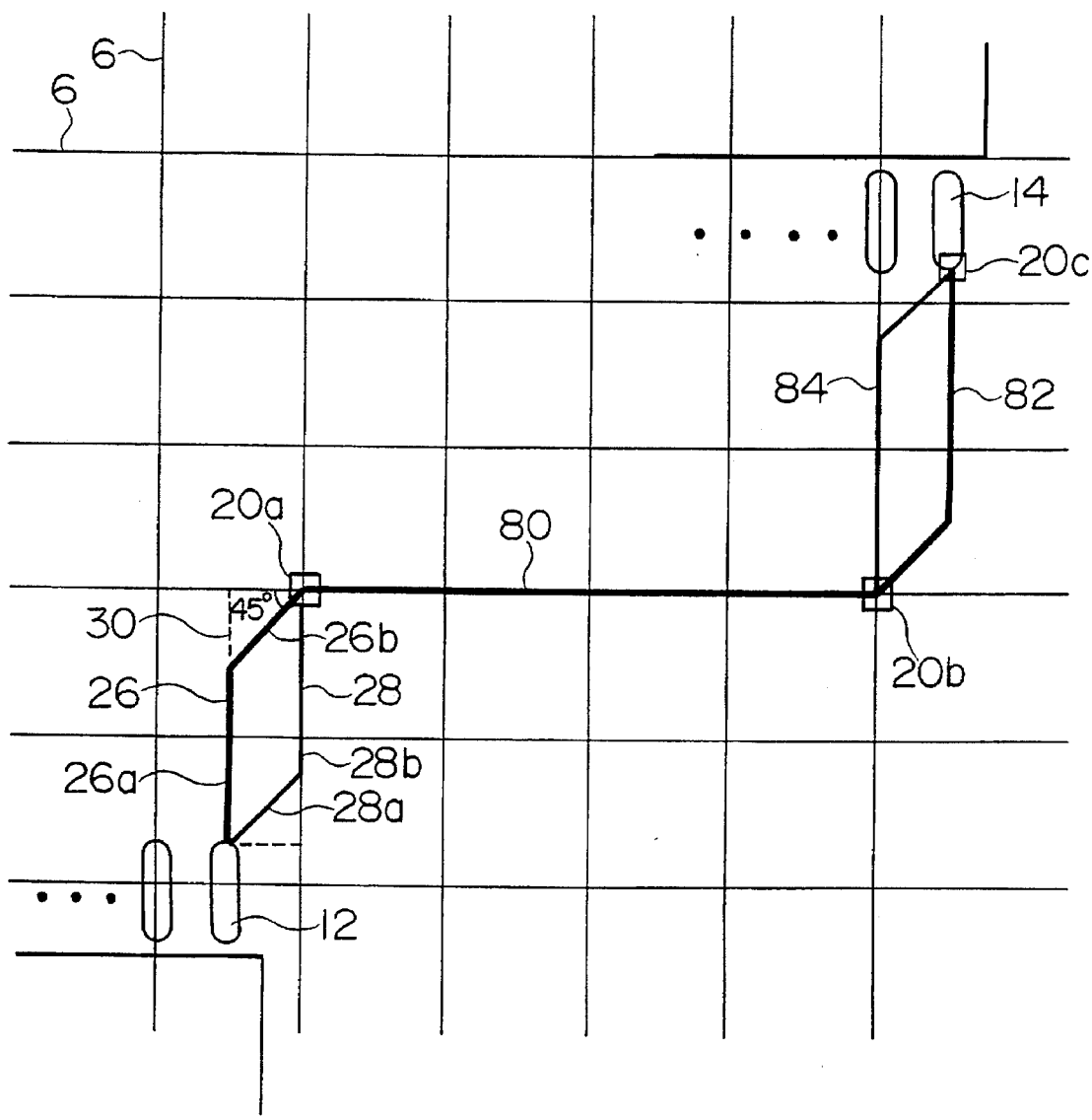
FIG. 4 is a view describing a method for producing a wiring pattern step by step.
Figure 5:
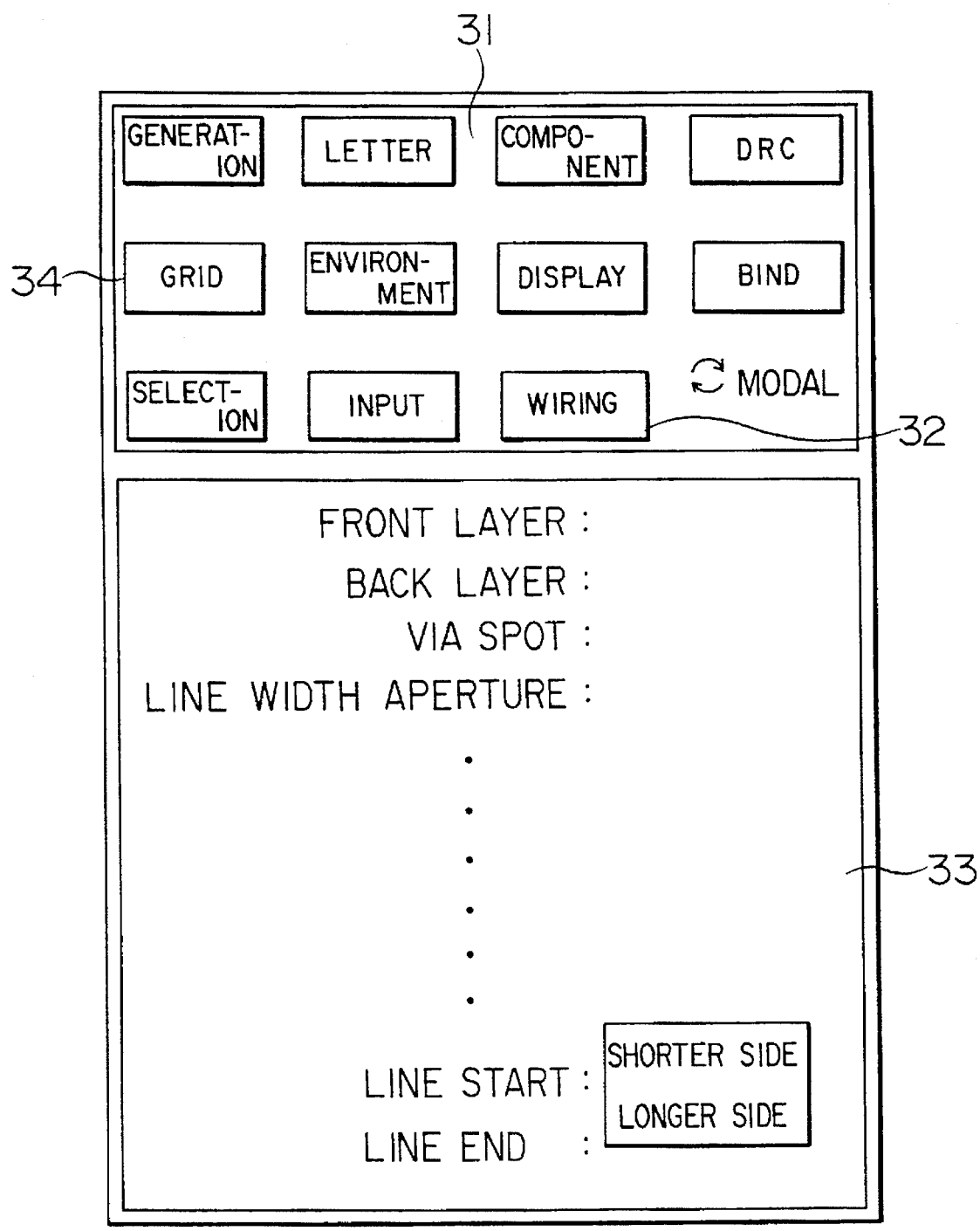
FIG. 5 is a view showing a window for setting a wiring pattern generation rule.

As shown in FIG. 4, when a point 20a which is neither in the X direction of the wiring start point 12 nor in the Y direction thereof is designated, the start wiring pattern generation rule designates the wiring pattern being generated between the point 12 and the point 20a as a pattern 26 or a pattern 28. Assuming a rectangle 30 having horizontal sides and vertical sides with the wiring start point 12 and the designated point 20a as diagonal points, the wiring pattern 26 is composed of a segment 26a going from the wiring start point 12 along the longer side of the rectangle 30 and a segment 26b going from the segment 26a to the designated point 20a at a particular angle for example 45° against the horizontal side of the rectangle 30. On the other hand, the wiring pattern 28 is composed of a segment 28a going from the wiring start point 12 at a slope for example 45° and a segment 28b going from the intersection with the longer side of the rectangle 30 along the longer side to the designated point 20a. The former wiring pattern 26 is defined as a longer side mode, while the latter wiring pattern 28 is defined as a shorter side mode. When one of the longer side and the shorter side is selected at a start column of a menu 33 of a wiring item 32 on a wiring pattern generation rule setting window 31 as shown in FIG. 5, the start wiring pattern generation rule is set by the pattern generation rule setting unit 24. The wiring pattern generation rule setting unit 24 also produces data for displaying the wiring pattern generation rule setting window 31 on the display 1a in accordance with the data of the storage device. When an angle is written to the menu of a grid item 34 on the window 31, the slope of the segments 26b and 28a is determined. The angle may be in the range of 0° to 90°. The start wiring pattern generation rule can be set by the shape or the like of a component terminal which is the wiring start point 12. In the example as shown in FIG. 4, since the shape of the terminal of the wiring start point is oval, the longer side mode is selected.

As described above, the dummy wiring pattern generating unit 16 generates the dummy wiring pattern numbered 26 between the wiring start point 12 and the designated point 20a in accordance with the start wiring pattern generation rule which is set in the wiring pattern generation rule setting unit 24. When the designated point 20a is placed on the grid 6, even if the wiring start point 12 is not present on the grid 6, a pattern can be readily started vertically from the wiring start point 12 and ended on the grid 6. Further, if the designated point 20a is designated on an intersection point of the grid, the following wiring pattern may be easily generated.

A rubber band display controlling unit 42 displays a dummy wiring pattern generated by the dummy wiring pattern generating unit 16 on the display 1a. When at this time another dummy wiring pattern has already been displayed, it is cleared and then the new dummy wiring pattern is displayed. Thus, by the rubber band display controlling unit 42, as the designated point 20a moves, a dummy wiring pattern generated by the dummy wiring pattern generating unit 16 is displayed on the display 1a like a rubber band on the real time basis. Thereby, the operator can look for a suitable pattern by designating a point as desired, for example, on an intersection point while moving the designated point 20a with the pointing device.

At the same time, a pattern check unit 44 determines whether a dummy wiring pattern generated by the dummy wiring pattern generating unit 16 has enough distance from other pattern elements in accordance with a preset pattern check condition and then notifies the operator of the resultant data by means such as a color display, a buzzer, and a message.

Figure 6:
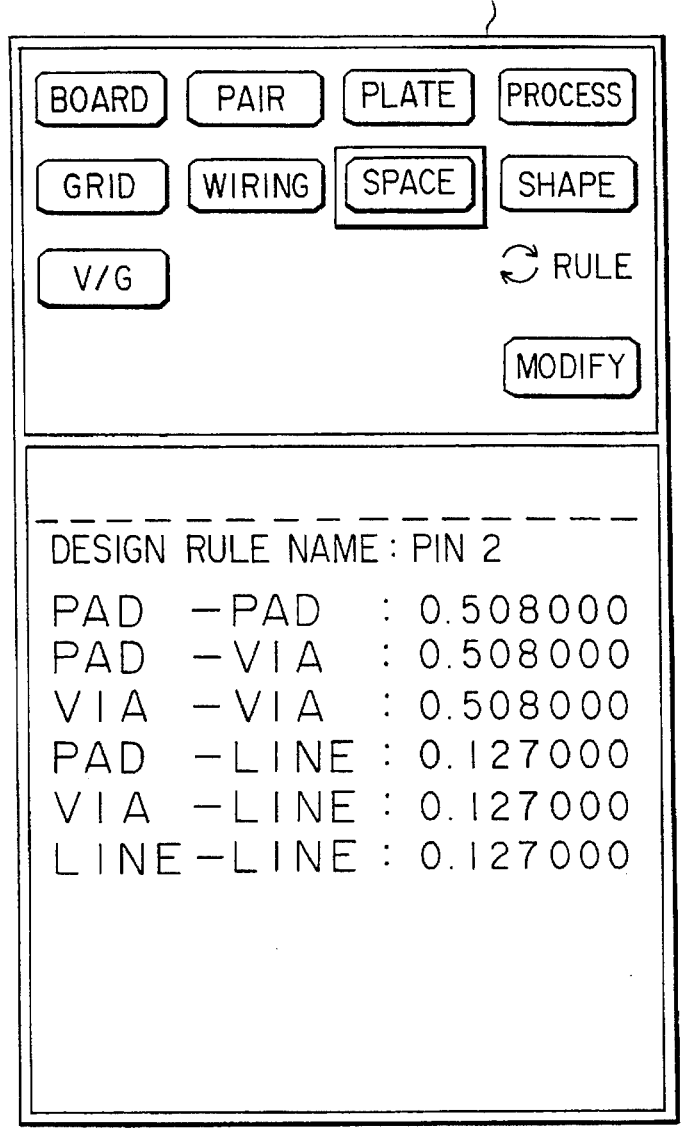
FIG. 6 is a view showing a window for setting a pattern check condition.

The pattern check condition is preset by a pattern check condition setting unit 46. For example, an allowable distance between a particular wiring pattern and each element which blocks the pattern is designated with a numeric value through a pattern check condition setting window 61 as shown in FIG. 6 and thereby the pattern check condition is set. The pattern check condition setting unit 46 also produces data for displaying the pattern check condition setting window 61 on the display 1a in accordance with the data stored in the storage device 2. In an example as shown in FIG. 6, allowable values of distances between PAD and PAD, between PAD and VIA, between VIA and VIA, between PAD and LINE, between VIA and LINE, and between LINE and LINE are called from the design rule file 2c and then set.

Figure 7:
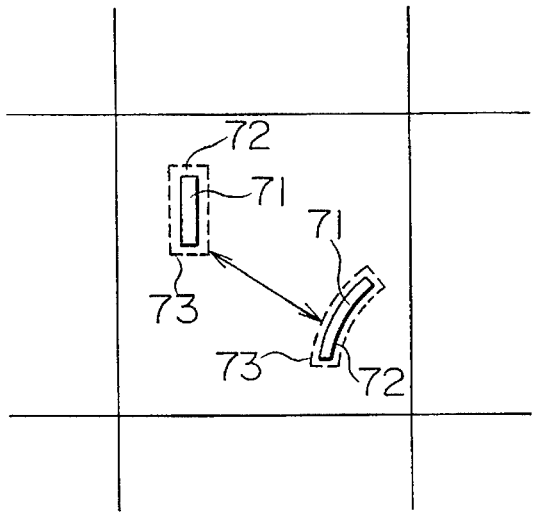
FIG. 7 is a view describing a method for checking a pattern.

As shown in FIG. 7, the pattern checking unit 44 assumes a FIG. 73 with a space 72 of an allowable gap value in the vicinity of each element 71 in accordance with the allowable gap values among elements, the allowable gap values being set by the pattern check condition setting unit 46. Thereafter, the pattern checking unit 44 meshes the printed wiring board in a particular size, calculates mutual distance of each FIG. 73 in each meshed area, detects whether there are intersections, and determines whether or not the space between elements 7 is enough.

A wiring pattern setting unit 76 is a means for setting a dummy wiring pattern which is displayed on the screen through the rubber band display controlling unit 42. When the operator inputs a set signal, the wiring pattern setting unit 76 sets a dummy wiring pattern supplied from the pattern checking unit 44 as a wiring pattern and displays the wiring pattern on the display 1a through the wiring pattern displaying unit 78. The set point storing unit 22 stores the coordinates of the designated point 20a which is set by the wiring pattern setting unit 76 to supply the coordinates to the dummy wiring pattern generating unit 16 as the beginning point of the following pattern.

As described above, when a wiring pattern is set between a wiring start point 12 and a designated point 20a, a dummy wiring pattern may then be generated between a point 20b designated by the pointing device and a set point 20a which was previously a designated point in accordance with the start wiring pattern generation rule which is preset in the wiring pattern generation rule setting unit 24. Normally, since a wiring pattern along the grid 6 can be readily designed, a designated point 20b is placed on the same segment of the grid as a set point 20a and a horizontal wiring pattern 80 is generated between the set point 20a and the designated point 20b.

When a horizontal wiring pattern 80 is set, the designated point 20b is stored as a new set point in the set point storing unit 22 and a wiring pattern is generated between the set point 20b and the next designated point 20c.

When the wiring end point 14 is designated by the pointing device, the dummy wiring pattern generating unit 16 detects that the designated point 20c meets the wiring end point 14 and generates a dummy wiring pattern in the longer side mode 82 or the shorter side mode 84 in accordance with an end wiring pattern generation rule which has been preset in the wiring pattern generation rule setting unit 24. In this case, the longer side mode or the shorter side mode is determined based on the designated point which is the wiring end point. The end wiring pattern generation rule is set on the wiring pattern generation rule setting window 31 like the start wiring pattern generation rule. When the wiring end point 14 is an oval terminal, the longer side mode which ends a vertical segment is selected.

As described above, if the set point storing unit 22 does not store a set point, the dummy wiring pattern generating unit 16 recognizes the wiring start point 12 as a beginning point. If the set point storing unit 22 stores a set point, the dummy wiring pattern generating unit 16 recognizes the stored set point as a beginning point so that a dummy wiring pattern is generated between the beginning point and the designated point.

Although a wiring pattern generated between a set point 20a and a designated point 20b which is not a wiring end point follows the start generation rule, it may follow the end generation rule.

Figure 8:
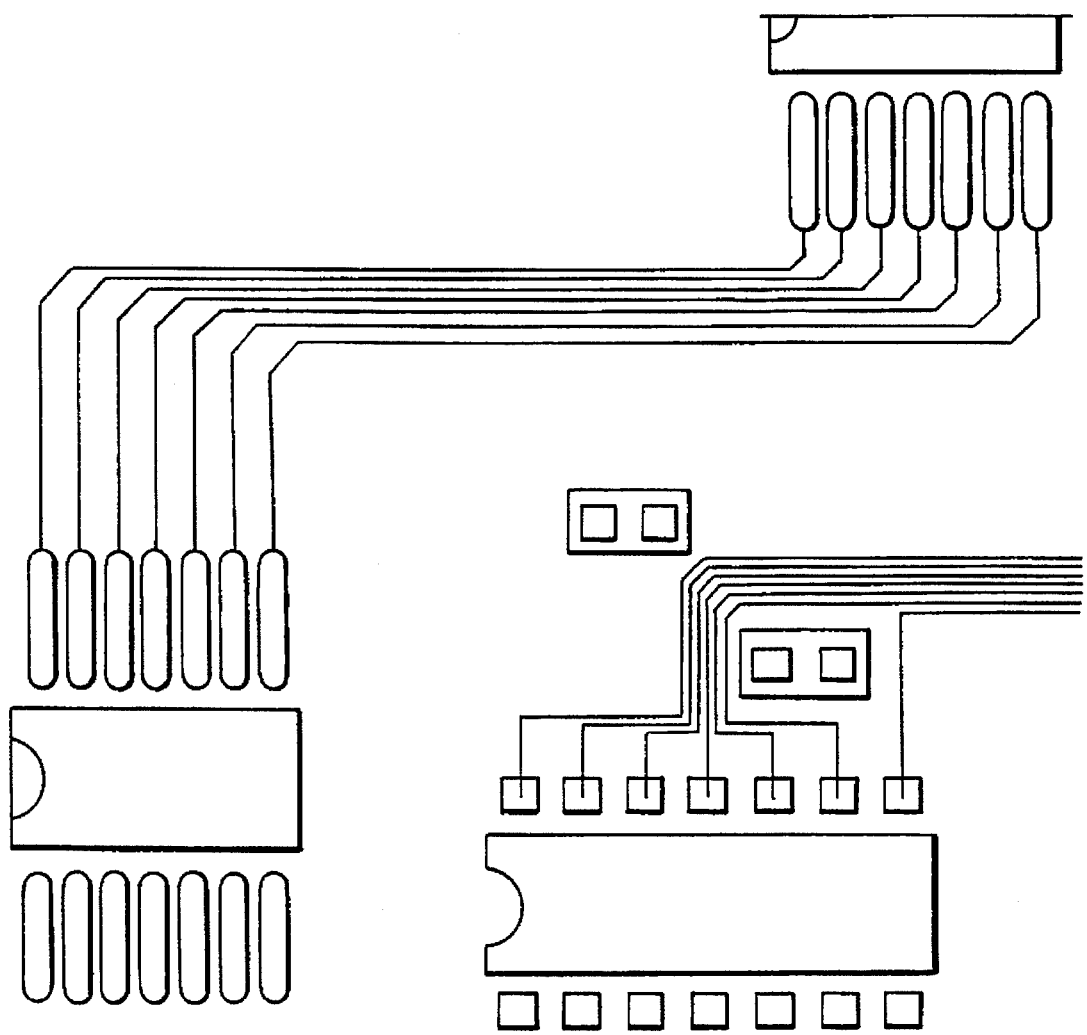
FIG. 8 is a view showing one example of wiring patterns on a board designed according to the present invention.

By the above mentioned wiring pattern generation step, a wiring pattern, for example represented with a thick line in FIG. 4, is generated between the wiring start point 12 and the wiring end point 14. When one wiring pattern is set between a wiring start point and a wiring end point, the next wiring route is selected by the wiring route designating unit 7. Wiring patterns are designed in the same manner as described above, so that a wiring pattern designed as shown in FIG. 8 can be obtained.

As described above, according to the present invention, wiring patterns can be designed in accordance with the shape of terminals of components for use on a printed wiring board. In addition, the operator can design non-grid patterns such as wiring patterns connected from component terminals which are not present on the grid without considering the grid. Furthermore, because patterns are checked in the dummy wiring pattern generating stage, suitable patterns free of wiring defects can be effectively designed.

In the above embodiment, although the function of checking patterns after generation of dummy wiring patterns is provided, another embodiment where patterns are checked after completion of all wiring patterns does not depart from the spirit of the present invention.

In the above embodiment, the wiring pattern generation rule is previously set and then only one dummy wiring pattern is generated and displayed. However, two dummy wiring patterns are displayed on the display 1a and then the operator may select one of the two patterns.

Although the preferable embodiments are described above, the present invention is not limited to these embodiments. Various changes and modifications may be made without departing from the spirit and scope of the present invention as defined in the appended claims.

What is claimed is:

1. A method of designing a wiring pattern between two terminals to be connected thereby, by using a CAD system having an input device, a pointing device, and a display screen, comprising the steps of:

producing a first image signal identifying a beginning point on a display screen;

storing the first image signal in a storage device;

receiving a second image signal from the pointing device representing a designated point on the screen;

storing the second image signal in said storage device;

receiving a signal from the input device representing a predetermined angle; and automatically generating on the screen a line pattern, designating an electrically conductive wiring path in a circuit design, between the beginning point and the designated point using said first and second stored signals and said predetermined angle, said line pattern having a selected one of the following configurations dependent upon the shape of the terminal:

a side segment drawn from the beginning point in one of vertical and horizontal directions and an oblique segment drawn at said predetermined angle relative to the horizontal direction from the designated point when the designated point is not in one of horizontal and vertical directions from the beginning point, the side and oblique segments of the line pattern meeting at a side of an imaginary rectangle having diagonal corners respectively located by the beginning point and the designated point, and an oblique segment drawn at said predetermined angle relative to the horizontal direction from the beginning point when the designated point is not in one of horizontal and vertical directions from the beginning point, and a side segment drawn from the designated point in one of vertical and horizontal directions, the side and oblique segments of the line pattern meeting at a side of an imaginary rectangle having diagonal corners respectively located by the beginning point and the designated point.

2. The method as set forth in claim 1, further comprising the steps of:

determining whether the line pattern drawn between the beginning point and the designated point is at least a predetermined distance from other pattern elements; and notifying an operator of results obtained by the determining step.

3. The method as set forth in claim 1, wherein at least one point chosen from a set including the beginning point and the designated point is placed on a predefined grid, said grid having a set of regularly spaced horizontal and vertical intersecting lines displayed on the screen for supporting design of the wiring pattern.

4. The method as set forth in claim 1, wherein the predetermined angle is 45°.

5. The method as set forth in claim 1, further comprising the step of:

generating a wiring start point and a wiring end point for display on the screen according to instructions entered from the input device;

wherein the step of producing the first image signal identifying a beginning point comprises the step of:

recognizing the wiring start point as the beginning point when no line pattern has yet been drawn from the wiring start point and recognizing an ending point of the pattern as the beginning point when a line pattern has already been drawn from the wiring start point but not to the wiring end point.

6. The method as set forth in claim 5, further comprising the steps of:

determining whether the line pattern drawn between the beginning point and the designated point is at least a predetermined distance from other pattern elements; and notifying an operator of results obtained by the determining step.

7. The method as set forth in claim 5, wherein at least one point chosen from a set including the beginning point and the designated point is placed on a predefined grid, said grid having a set of regularly spaced horizontal and vertical intersecting lines displayed on the screen for supporting design of the wiring pattern.

8. The method as set forth in claim 5, wherein the predetermined angle is 45°.

9. A CAD system for designing a wiring pattern adapted to a printed wiring board having terminals, comprising:

an input device for inputting a predetermined angle;

a pointing device for picking an unconnected route between the terminals to be wired by the wiring pattern;

a display device having a screen for displaying a drawing of the printed wiring board;

a wiring pattern generating unit for determining a wiring start point and a wiring end point in the drawing displayed on the screen according to instructions fed from the pointing device;

a wiring route designating unit for identifying a beginning point by recognizing the wiring start point as the beginning point when no wiring pattern has yet been drawn from the wiring start point and by recognizing an ending point of the wiring pattern as the beginning point when a wiring pattern has been drawn from the wiring start point but not to the wiring end point;

a dummy wiring pattern generating unit for generating a dummy wiring pattern between the beginning point and a point designated by the pointing device in the drawing displayed on the screen, said dummy wiring pattern between the beginning point and the designated point having a selected one of the following configurations dependent upon the shape of the terminal:

a side segment drawn from the beginning point in one of vertical and horizontal directions and an oblique segment drawn at the predetermined angle relative to the horizontal direction from the designated point, when the designated point is not in one of horizontal and vertical directions from the beginning point, the side and oblique segments of the dummy wiring pattern meeting at a side of an imaginary rectangle having diagonal corners respectively located by the beginning point and the designated point, and an oblique segment drawn at said predetermined angle relative to the horizontal direction from the beginning point when the designated point is not in one of horizontal and vertical directions from the beginning point, and a side segment drawn from the designated point in one of vertical and horizontal directions, the side and oblique segments of the line pattern meeting at a side of an imaginary rectangle having diagonal corners respectively located by the beginning point and the designated point; and a pattern generation rule setting unit for defining whether the side segment or the oblique segment is drawn from the beginning point, based on information entered from the pointing device.

10. The CAD system as set forth in claim 9, further comprising a pattern checking unit for determining whether the dummy wiring pattern generated between the beginning point and the designated point is at least a predetermined distance from other pattern elements, and for notifying an operator of results of the distance determination.

11. The CAD system as set forth in claim 9, wherein at least one point chosen from a set including the beginning point and the designated point is placed on a predefined grid, said grid having a set of regularly spaced horizontal and vertical intersecting lines displayed on the screen for supporting design of the wiring pattern.

12. The CAD system as set forth in claim 9, wherein the predetermined angle is 45°.

13. A CAD system for designing a wiring pattern adapted to a printed wiring board having terminals, comprising:

an input device for inputting a predetermined angle;

a pointing device for picking an unconnected route between the terminals to be wired by the wiring pattern;

a display having a screen for displaying a drawing of the printed wiring board;

means for determining a wiring start point and a wiring end point in the drawing displayed on the screen in accordance with instructions entered from the pointing device;

means for identifying a beginning point by recognizing the wiring start point as the beginning point when no wiring pattern has yet been drawn from the wiring start point and by recognizing an ending point of a wiring pattern as the beginning point when the pattern has been drawn from the wiring start point but not to the wiring end point;

means for generating a wiring pattern between the beginning point and a point designated by the pointing device in the drawing displayed on the screen, said wiring pattern between the beginning point and the designated point having a selected one of the following configurations dependent upon the shape of the terminal:

a side segment drawn from the beginning point in one of vertical and horizontal directions, and an oblique segment drawn at the predetermined angle relative to the horizontal direction from the designated point when the designated point is not in one of horizontal and vertical directions from the beginning point, the side segments of the wiring pattern meeting at a side of an imaginary rectangle having diagonal corners respectively located by the beginning point and the designated point, and an oblique segment drawn at said predetermined angle relative to the horizontal direction from the beginning point when the designated point is not in one of horizontal and vertical directions from the beginning point, and a side segment drawn from the designated point in one of vertical and horizontal directions, the side and oblique segments of the line pattern meeting at a side of an imaginary rectangle having diagonal corners respectively located by the beginning point and the designated point; and means for predefining a start wiring pattern generation rule specifying whether the side segment or the oblique segment is drawn from the beginning point when the designated point is different from the wiring end point and for predefining an end wiring pattern generation rule specifying whether the side segment or the oblique segment is drawn from the wiring end point when the designated point is the same as the wiring end point;

wherein said wiring pattern generating means comprises:

means for determining whether or not the designated point is the same as the wiring end point and for generating a dummy wiring pattern including the side segment and the oblique segment between the beginning point and the designated point on the screen in accordance with either of the predefined rules when the designated point is not in one of horizontal and vertical directions from the beginning point;

means for setting the generated dummy wiring pattern as a wiring pattern in accordance with a signal entered by the pointing device; and means for storing coordinates of the designated point set by the setting means when the designated point is not the wiring end point, and supplying the coordinates to the beginning point identifying means as a next beginning point.

14. The CAD system as set forth in claim 13, wherein said wiring pattern generating means further comprises means for determining whether the dummy wiring pattern generated between the beginning point and the designated point is at least a predetermined distance from other pattern elements, and for notifying an operator of results of the distance determination.

15. The CAD system as set forth in claim 13, wherein at least one point chosen from a set including the beginning point and the designated point is placed on a predefined grid, said grid having a set of regularly spaced horizontal and vertical intersecting lines displayed on the screen for supporting design of the wiring pattern.

16. The CAD system as set forth in claim 13, wherein the predetermined angle is 45°.

17. A method of designing a wiring pattern for connection to first and second terminals of a first device by using a CAD system having an input device, a pointing device, and a display screen, comprising the steps of:

displaying a first pattern representing the first device on the display screen;

displaying the first and second terminals along a side of the first pattern, the first and second terminals being collinear along a terminal line and being adjacent to each other;

identifying a first beginning point at said first terminal and displaying said first beginning point on the display screen;

identifying a second beginning point at said second terminal and displaying said second beginning point on the display screen;

designating a first designated point on the display screen in response to a first input signal;

designating a second designated point on the display screen in response to a second input signal;

generating a display of a first line pattern between the first beginning point and the first designated point, said first line pattern having a selected one of the following configurations:

a side segment drawn from the first beginning point in one of vertical and horizontal directions and an oblique segment drawn at a predetermined angle relative to the horizontal direction from the first designated point when the first designated point is not in one of horizontal and vertical directions from the first beginning point, the side and oblique segments of the first line pattern meeting at a side of an imaginary rectangle having diagonal corners respectively located by the first beginning point and the first designated point, wherein said side segment of said first line pattern is perpendicular to said terminal line, and an oblique segment drawn at said predetermined angle relative to the horizontal direction from the first beginning point when the first designated point is not in one of horizontal and vertical directions from the first beginning point, and a side segment drawn from the first designated point in one of vertical and horizontal directions, the side and oblique segments of the line pattern meeting at a side of an imaginary rectangle having diagonal corners respectively located by the first beginning point and the first designated point, wherein said side segment of said first line pattern is not perpendicular to said terminal line; and generating on the screen a second line pattern between the second beginning point and the second designated point, said second line pattern having a selected one of the following configurations:

a side segment drawn from the second beginning point in one of vertical and horizontal directions and an oblique segment drawn at a predetermined angle relative to the horizontal direction from the second designated point when the second designated point is not in one of horizontal and vertical directions from the second beginning point, the side and oblique segments of the second line pattern meeting at a side of another imaginary rectangle having diagonal corners respectively located by the second beginning point and the second designated point, wherein said side segment of said second line pattern is perpendicular to said terminal line, and an oblique segment drawn at said predetermined angle relative to the horizontal direction from the second beginning point when the second designated point is not in one of horizontal and vertical directions from the second beginning point, and a side segment drawn from the second designated point in one of vertical and horizontal directions, the side and oblique segments of the line pattern meeting at a side of an imaginary rectangle having diagonal corners respectively located by the second beginning point and the second designated point, wherein said side segment of said second line pattern is not perpendicular to said terminal line.

18. A CAD system for designing wiring patterns to interconnect device terminals, comprising:

input means for inputting a predetermined angle;

pointing means for picking an unconnected route between the terminals to be wired by the wiring pattern;

screen display means;

storage means;

means for recognizing a first set of input signals from the input means representing a first device;

means for storing said first set of input signals in the storage means;

means for displaying the first set of input signals on the display means;

means for recognizing a second set of input signals from the input means representing terminals of said first device;

means for storing said second set of input signals in the storage means;

means for displaying said second set of input signals on the display means;

means for recognizing an input signal identifying a first designated point;

means for storing said signal identifying the first designated point in the storage means;

means for displaying the first designated point on the display means;

means for recognizing a signal identifying a first beginning point on one of the terminals of the first device;

means for storing said signal identifying the first beginning point in the storage means;

means for displaying the first beginning point on the display device;

means for drawing a line pattern, designating an electrically conductive wiring path in a circuit design, between said first designated point and said first beginning point on the screen display means, said line pattern having a selected one of the following configurations dependent upon the shape of the terminal recognized as the first beginning point:

a side segment drawn from the first beginning point in one of vertical and horizontal directions and an oblique segment drawn at the predetermined angle relative to the horizontal direction from the first designated point, when the first designated point is not in one of horizontal and vertical directions from the first beginning point, the side and oblique segments of the line pattern meeting at a side of an imaginary rectangle having diagonal corners respectively located by the first beginning point and the first designated point, and an oblique segment drawn at said predetermined angle relative to the horizontal direction from the first beginning point when the first designated point is not in one of horizontal and vertical directions from the first beginning point, and a side segment drawn from the first designated point in one of vertical and horizontal directions, the side and oblique segments of the line pattern meeting at a side of an imaginary rectangle having diagonal corners respectively located by the first beginning point and the first designated point.

\* \* \* \* \*